United States Patent [19]

Smith et al.

[11] Patent Number: 5,047,982
[45] Date of Patent: Sep. 10, 1991

[54] WRITE PROTECTION METHOD AND APPARATUS FOR AN EEPROM

[75] Inventors: Vernon R. Smith; Alan L. Stahl, both of Peoria, Ill.

[73] Assignee: Caterpillar, Inc., Peoria, Ill.

[21] Appl. No.: 567,809

[22] Filed: Apr. 12, 1990

[51] Int. Cl.⁵ .................... G11C 16/00; G11C 7/00; G06F 12/14

[52] U.S. Cl. .................... 365/185; 365/195; 364/200

[58] Field of Search ........... 365/175, 185, 210, 230.02, 365/226; 380/3, 4

[56] References Cited

U.S. PATENT DOCUMENTS 4,578,774  3/1986  Muller ........................ 365/195
4,864,542  10/1989  Oshima et al. ............... 365/195

FOREIGN PATENT DOCUMENTS 0293797  11/1988  Japan ........................ 365/230.02

Primary Examiner—Joseph A. Popek
Assistant Examiner—Jack A. Lane
Attorney, Agent, or Firm—Kirk A. Vander Leest

[57] ABSTRACT

The subject invention provides an apparatus for controllably programming an EEPROM, thereby reducing the likelihood of an inadvertent EEPROM write. The apparatus includes a first circuit which repeatedly produces a pseudo address signal at a preselected frequency. A second circuit receives the pseudo address signal and deliveries a write-enable signal to the EEPROM in response to receiving the pseudo address signal a preselected number of times. A third circuit delivers an address signal and a corresponding data signal to the EEPROM during at least a portion of the production of the write-enable signal. The address signal is indicative of an address location in said EEPROM and the data signal corresponds to the data to be stored in the EEPROM address location.

14 Claims, 3 Drawing Sheets

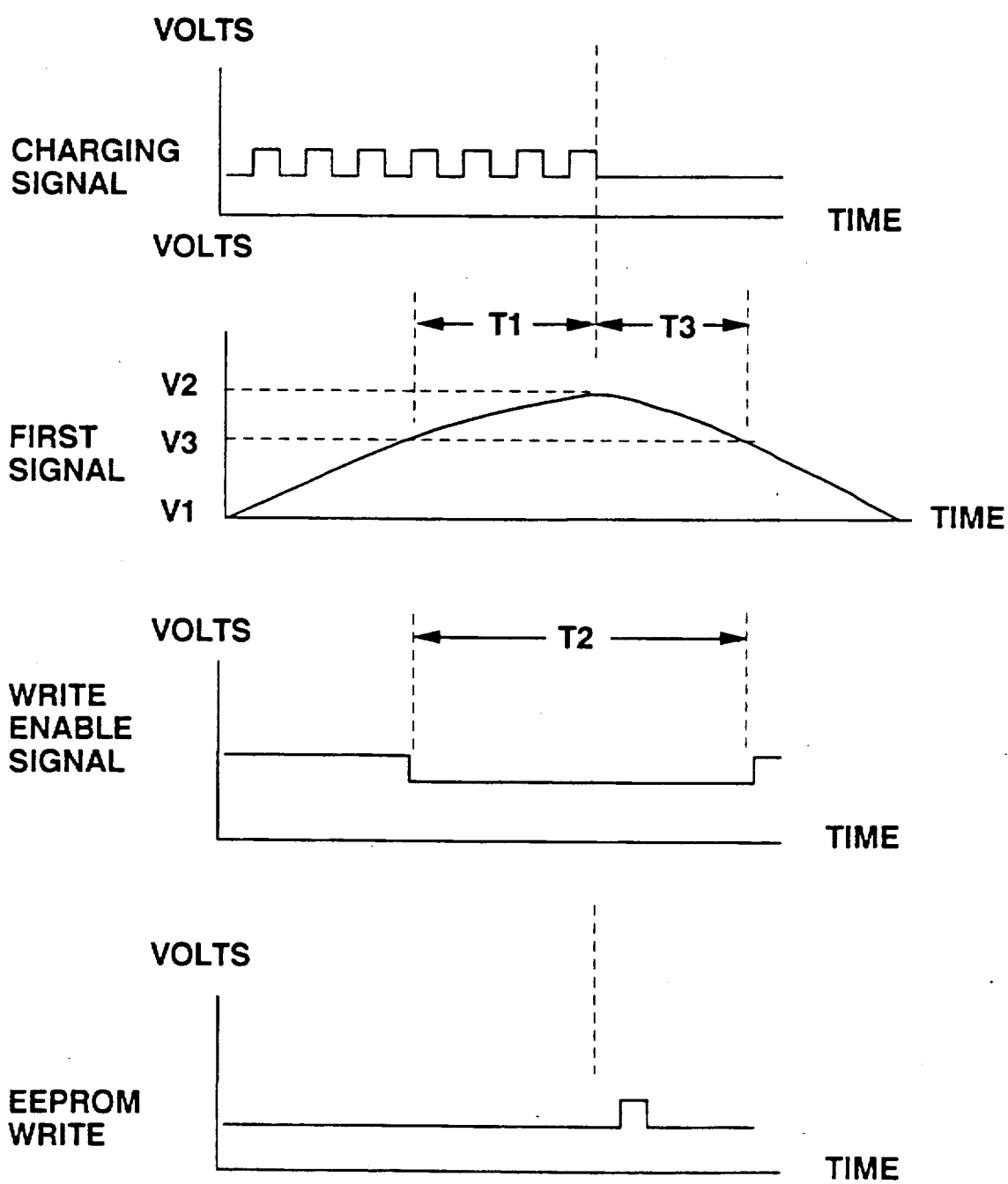
Fig_2_

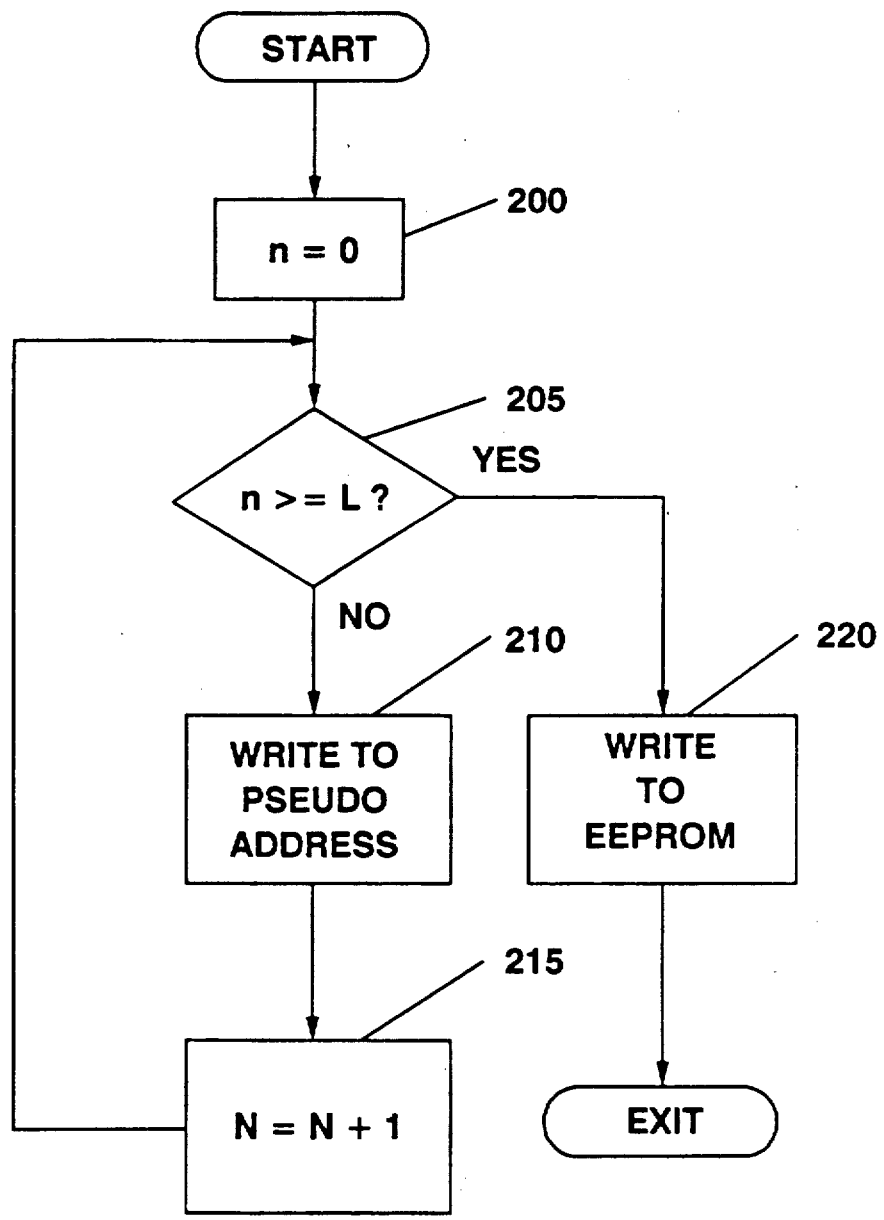
Fig_3_

WRITE PROTECTION METHOD AND APPARATUS FOR AN EEPROM

TECHNICAL FIELD

This invention is related generally to write protection for a memory device and, more particularly, to a method and apparatus for preventing inadvertent writes to an Electrically Erasable Programmable Read Only Memory (EEPROM) unit.

BACKGROUND ART

Nonvolatile memory devices such as Read Only Memory (ROM) units have long been used in microprocessor based systems for storing data which must be repeatedly accessed during program execution. ROM's are advantageous over other memory devices such as a Random Access Memory (RAM), for example, because the contents of a ROM are not lost if the microprocessor system looses electrical power or is turned "off". However, once the ROM has been configured, the data cannot be changed. In many applications it is desirable to store data and thereafter controllably change the stored data. In such instances, a Programmable ROM (PROM), such as an EEPROM, is used. For example, an EEPROM can be used in a vehicle control system for storing calibration data associated with various vehicle sensors. Over time it may be desirable to recalibrate the sensors, due to changes in tolerances, for example. A calibration subroutine can be provided for automatically overwriting the old calibration data in the EEPROM with new, accurate calibration data. However by allowing the data in an EEPROM to be changed, the probability that the stored data will be accidentally overwritten is increased.

In order to reduce the chance of an inadvertent write to the EEPROM, most EEPROMs require the presence of a write-enable signal simultaneous with a write instruction to the EEPROM. This dramatically reduces the likelihood of an inadvertent EEPROM write; but, in some situations, it is still possible for the stored data to be accidentally overwritten. For example, if the program counter becomes lost during program execution, an operand can be mistakenly interpreted as an operation opcode. If the operand corresponds to a write command, the contents of the EEPROM can be overwritten. An inadvertent write of this nature in a vehicle control system could have serious effects on vehicle operation. Therefore, it is desirable to provide extra protection against inadvertent EEPROM writes.

The present invention is directed to overcoming one or more of the above problems by providing a method and apparatus for reducing the likelihood of an inadvertent EEPROM write.

DISCLOSURE OF THE INVENTION

In accordance with one aspect of the present invention, there is provided an apparatus for controllably programming a nonvolatile EEPROM. The EEPROM is of the type which requires a write-enable signal during programming. A first circuit repeatedly produces a pseudo address signal at a preselected frequency. A second circuit receives the pseudo address signal and delivers a write-enable signal to the EEPROM in response to receiving the pseudo address signal a preselected number of times. A third circuit delivers an address signal and a corresponding data signal to the EEPROM during at least a portion of the production of the write-enable signal. The address signal is indicative of an address location in the EEPROM and the data signal corresponds to the data to be stored in the EEPROM address location.

BRIEF DESCRIPTION OF THE DRAWINGS

FIG. 2 illustrates certain signals produced by the preferred embodiment; and

FIG. 3 is a flowchart depicting a portion of software of the preferred embodiment.

BEST MODE FOR CARRYING OUT THE INVENTION

Figure 1:
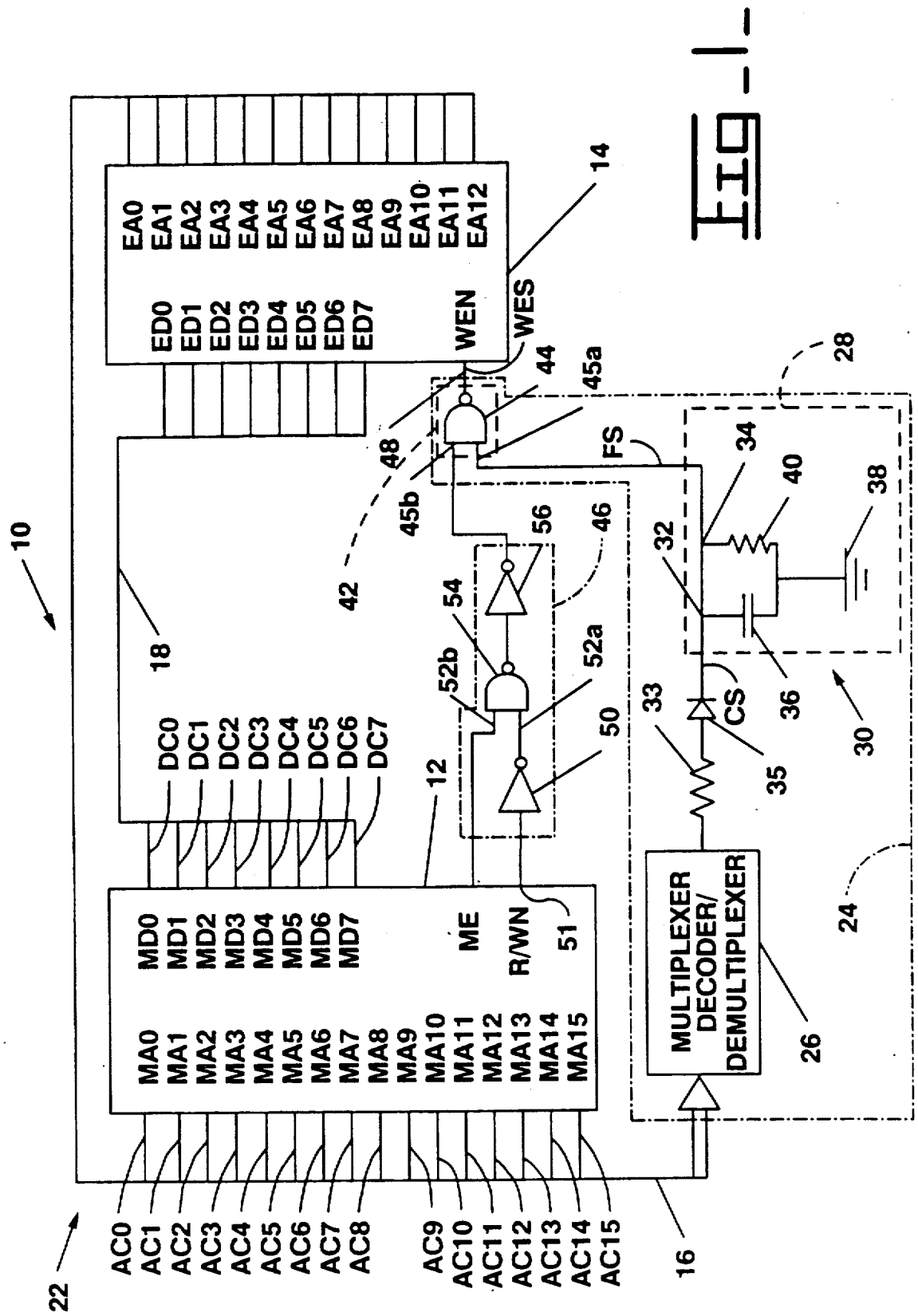
FIG. 1 is a block diagram of a preferred embodiment of the present invention.

Referring now to FIG. 1, an apparatus embodying certain principles of the present invention is generally indicated by the reference numeral 10. It should be understood that the following detailed description relates to the best presently known embodiment of the apparatus 10. However, the apparatus 10 can assume numerous other embodiments without departing from the appended claims, as will become apparent to those skilled in the art. Waveforms of various signals produced by the apparatus 10 are shown in FIG. 2, and these signals will be referenced throughout the description of the apparatus 10.

The apparatus 10 includes a microprocessor 12 having a plurality of address pins MA0-MA15 and a plurality of data pins MD0-MD7. In the preferred embodiment, the microprocessor 12 is a model MC6809 as manufactured by Motorola of Phoenix, Ariz. The microprocessor 12 operates under the control of software stored in an external ROM (not shown), as would be apparent to those skilled in the art.

A nonvolatile Erasable Electronically Programmable Read Only Memory (EEPROM) 14 is provided for storing data which can be accessed and periodically updated by the microprocessor 12. As mentioned in the background section, the stored data can correspond to sensor calibration data in a vehicle control system, for example. In the preferred embodiment the EEPROM 14 is an 8K model X2864A as manufactured by Xicor Incorporated of Milpitas, Calif. The EEPROM 14 has thirteen address pins EA0-EA12 and eight data pins ED0-ED7. The EEPROM address pins EA0-EA12 are connected to corresponding microprocessor address pins MA0-MA12 by respective electrical conductors AC0-AC12 which form an address bus 16. Similarly, the EEPROM data pins ED0-ED7 are connected to corresponding microprocessor data pins MD0-MD7 via respective electrical conductors DC0-DC7 which form a data bus 16.

During normal operation, the microprocessor 12 selectively accesses memory locations in the EEPROM 14 to retrieve stored data for use in a control program. The control program forms no part of the immediate invention and, therefore, will not be explained in greater detail. To retrieve data from the EEPROM 14, the microprocessor 12 produces a coded address signal, corresponding to an EEPROM memory location, on the address bus 16. The EEPROM 14 receives the address signal and produces a data signal on the data bus 18 in response to the received signal. The microprocessor 12 reads the data signal from the data bus 18 and uses the signal for further processing in the control program.

As mentioned previously, in many instances it may be desirable to change or add data in the EEPROM 14. When data is written to the EEPROM 14 (hereinafter referred to as an EEPROM write) the microprocessor 12 simultaneously produces an address signal on the address bus 16 and a data signal on the data bus 18. The address signal is indicative of an address location in the EEPROM 14, and the data signal corresponds to the data to be stored in that EEPROM memory location. In order for the data to be written to the EEPROM 14, a write-enable signal WES must be delivered to the EEPROM 14 simultaneously with the EEPROM write. In the preferred embodiment, the EEPROM 14 has a write enable pin WEN which must be pulled "low" to enable an EEPROM write. In prior systems, the microprocessor 12 is typically connected directly to the write enable pin WEN for delivering a write-enable signal WES. However, in such systems it is possible for the EEPROM 14 to be accidentally overwritten. Therefore, the immediate invention provides a means 20, intermediate the microprocessor 12 and the EEPROM 14, and an EEPROM write subroutine, the combination of which reduces the probability of inadvertent EEPROM writes.

More particularly, a first means 22 is provided for repeatedly producing a pseudo address signal which corresponds to an unused address code. Specifically, an EEPROM-write subroutine is accessed each time an EEPROM write occurs. The subroutine consists of a series of writes to the pseudo address followed by an EEPROM write. As such, the frequency of the pseudo address signal is responsive to the clock speed of the microprocessor 12. The number of writes to the pseudo address is empirically determined, as explained below.

As would be apparent to those skilled in the art, the actual subroutine can take numerous other forms. Referring now to FIG. 3, a flow diagram which is illustrative of software for embodying the EEPROM write subroutine is discussed. Initially, in the block 200, a counter N is initialized at zero. Thereafter, in the block 205, the counter N is compared to a predetermined limit L and control is passed to the block 210 if the counter N is less than the limit L. In the block 210, the microprocessor 14 produces a pseudo address signal on the address bus 16. Thereafter, in the block 215, the counter N is incremented by "one" and control is returned to the block 205. When the counter N equals or exceeds the limit L, control is passed to the block 220, thereby causing the EEPROM write.

A second means 24 receives the pseudo address signal and delivers a write-enable signal WES to the EEPROM 14 in response to receiving the pseudo address signal a preselected number of times. It is conceivable that the second means 24 could be embodied in a counter means which produces the write-enable signal WES in response to receiving the pseudo address signal a predetermined number of times. The second means 24 could also be embodied in an integrator which produces the write-enable signal WES in response to receiving the pseudo address signal a predetermined number of times within a preselected time limit.

In the preferred embodiment the second means 24 includes a decoder/demultiplexer 26 which receives the pseudo address signal and produces a charging signal CS in response thereto. The decoder/demultiplexer 26 consists of a series of decoders/demultiplexers (not shown) connected to the address bus 16 for receiving the pseudo address signal and producing the charging signal CS each time the pseudo address signal is received. The decoders/demultiplexers are advantageously connected such that only the pseudo address signal will cause the charging signal CS to be produced, as would be apparent to one skilled in the art. No other address signal causes the charging signal CS to be produced. In the preferred embodiment, the charging signal CS is a square-wave having a frequency responsive to the frequency of the pseudo address signal and, more particularly, to the clock speed of the microprocessor 12.

The second means 24 further includes a fourth means 28 which receives the charging signal CS and produces a first signal FS. The first signal FS varies between first and second voltage thresholds $V_1$, $V_2$ in response to the charging signal CS frequency. The fourth means 28 includes an R-C circuit 30 having an input terminal 32 serially connected to the multiplexer means 26 through a first resistor 33 and a diode 35. The R-C circuit input terminal 32 is adapted to receive the charging signal CS from the decoder/demultiplexer 26. The R-C circuit 30 further includes an output terminal 34 adapted to produce the first signal FS. A capacitor 36 is connected between the junction of the R-C circuit input and output terminals 32,34 and a source of low electrical potential 38, such as system ground. A second resistor 40 is also connected between the junction of the input and output terminals 32,34 and the source of low electrical potential 38. As the charging signal CS is repeatedly applied to the input terminal 32 of the R-C circuit 30, the charge across the capacitor 36 increases and, therefore, the magnitude of the first signal FS increases between the first and second voltage threshold $V_1, V_2$. The rate at which the first signal FS increases is responsive to the frequency of the charging signal CS, the ohmic value of the second resistor 40, and the capacitance of the capacitor 36.

A switch means 42 receives the first signal FS and produces the write-enable signal WES in response to the first signal FS reaching a third voltage threshold $V_3$ which is intermediate the first and second voltage thresholds $V_1, V_2$. In the preferred embodiment, the switch means includes a first NAND gate 44 having a first input terminal 45a connected to the R-C circuit output terminal 34 for receiving the first signal FS, and an output terminal adapted to produce the write-enable signal WES. The first NAND gate 44 further has a second input terminal 45b connected to a fifth circuit 46 for receiving an inverted second signal. The output of the first NAND gate 44 goes "low" in response to the first signal and the inverted second signal being greater than the third voltage threshold $V_3$. The output terminal of the first NAND gate 44 is connected to the EEPROM write-enable pin WEN by an electrical conductor 48.

As mentioned above, an EEPROM write can only occur when the write-enable pin WEN is pulled "low". The microprocessor 12 continues to produce the pseudo address for a period of time T1 after the write-enable signal goes "low", thereby providing a write-enable signal which is several clock pulses long. This ensures that the write-enable signal WES remains "low" for a period of time T2 which is greater than that required for an EEPROM write operation. After the pseudo address signal, and thus the charging signal stops, the first signal FS decays at a rate responsive to the R-C constant of the R-C circuit 30. The write-enable signal remains "low" for a period of time T3 which is equal to the time it takes the first signal to drop below the third voltage threshold V3. When the first signal FS falls below the third voltage threshold V3, the write-enable signal WES goes "high", thereby preventing an EEPROM write.

The fifth means 46 provides extra insurance against inadvertent EEPROM writes. The fifth means 46 includes a first inverter 50 having an input terminal connected to a read/write pin 51 on the microprocessor 12 for receiving a read/write signal. The read/write signal is "high" during a read operation and "low" during a write operation. The read/write signal is produced during reads and writes to any memory device. The first inverter 50 also has an output terminal connected to a first input terminal 52a of a second NAND gate 54. The first inverter 50 inverts the read/write signal and delivers the inverted signal to the first input terminal 52a of the second NAND gate 54.

The second NAND gate 54 further has a second input terminal 52b connected to an enable pin ME on the microprocessor 12 for receiving an enable signal. The enable signal is "high" whenever a write to any memory device occurs. The second NAND gate 54 also has an output terminal adapted to produce a second signal. More specifically, during a write operation the output terminal of the second NAND gate 54 goes "low" in response the the read/write and inverted enable signals being "high".

A second inverter 56 has an input terminal connected to the output terminal of the second NAND gate 54 for receiving the second signal. The second inverter 56 also includes an output terminal connected to the second input terminal 45b of the first NAND gate 44 for delivering the inverted second signal. Thus, the second input terminal 45b of the first NAND gate 44 is pulled "high" during any write operation.

As would be apparent to those skilled in the art, the apparatus 10 could be embodied in numerous other electrical circuits. For example, the first NAND gate 44 could be replaced with an inverter for receiving the first signal and producing the write-enable signal WES responsive thereto. In such an embodiment, the fifth means 46 would no longer be required. The fifth means 46 is provided only because the microprocessor 12 already produces the read/write and enable signals during a write operation, and these signals can be utilized for further insurance against inadvertent EEPROM writes.

INDUSTRIAL APPLICABILITY

Assume that the control program includes a calibration subroutine for recalibrating vehicle sensors (not shown). As part of the calibration subroutine, updated calibration data is written to the EEPROM memory locations associated with the sensor calibration data. When an EEPROM write is desired, control is passed to the EEPROM write subroutine. Initially, the subroutine performs a plurality of writes to an unused address location. More specifically, the microprocessor 12 produces a pseudo address signal, corresponding to an unused address location, a predetermined number of times at a preselected frequency on the address bus 16.

The decoder/demultiplexer means 26 receives the pseudo address signal and produces a charging signal CS at a frequency responsive to the frequency of the pseudo address signal. The charging signal CS is delivered to the input terminal 32 of the R-C circuit 30, thereby causing the voltage potential across the capacitor 36 to increase between the first and second voltage thresholds V1,V2. The R-C circuit 30 produces a first signal FS at its output terminal 34 which is equal in magnitude to the voltage potential across the capacitor 36.

The switch means 42 receives the first signal and produces the write-enable signal WES in response to the first signal FS reaching the third voltage threshold V3. More specifically, the output of the NAND gate 44 is pulled "low" as long as the first signal is larger than the third voltage threshold V3. When the charging signal CS stops, the first signal FS decays between the second and first voltage thresholds V2,V1. The write-enable signal WES goes "high", thus preventing an EEPROM write, when the first signal FS falls below the third voltage threshold V3. The number of times that the pseudo address signal is produced is selected such that the write-enable signal WES remains "low" for a period of time T1 which substantially larger than the amount of time required for an EEPROM write. During at least a portion of the time T1 when the write-enable signal is "low", the microprocessor produces an address signal and a corresponding data signal (EEPROM write) on the address and data buses 16,18, respectively. The address signal corresponds to an address location in the EEPROM where calibration data is stored, and the data signal is indicative of the calibration data to be stored at that EEPROM data address.

Other aspects, objects, and advantages of this invention can be obtained from a detailed study of the drawings, the disclosure, and the appended claims.

What is claimed is:

1. An apparatus for controllably programming a nonvolatile electrically erasable programmable read only memory (EEPROM), said EEPROM being of the type which requires a write-enable signal during programming, comprising:
   a microprocessor adapted to repeatedly produce a pseudo address signal at a preselected frequency, said pseudo address signal corresponding to an unused memory address code;
   second means for receiving said pseudo address signal and delivering a write-enable signal to said EEPROM in response to receiving said pseudo address signal a preselected number of times; and
   third means for delivering an address signal and a corresponding data signal to said EEPROM while said write-enable signal is produced, said address signal being indicative of an address location in said EEPROM and said data signal corresponding to the data to be stored in said EEPROM address location.

2. The apparatus as set forth in claim 1 wherein said second means produces said write-enable signal in response to receiving said pseudo address signal a predetermined number of times within a preselected time period.

3. The apparatus as set forth in claim 2 wherein said second means includes an integrator means.

4. The apparatus as set forth in claim 1 wherein said second means includes a counter means.

5. An apparatus as set forth in claim 1 wherein said second means includes:
   a decoder/demultiplexer for receiving said pseudo address signal and producing a charging signal in response thereto;

fourth means for receiving said charging signal and producing a first signal which varies between first and second thresholds in response thereto; and switch means for receiving said first signal and producing said write-enable signal in response to said first signal reaching a preselected magnitude.

6. The apparatus as set forth in claim 5 wherein said decoder/demultiplexer repeatedly produces said charging signal at a frequency responsive to the frequency of production of said pseudo address signal.

7. The apparatus as set forth in claim 6 wherein the magnitude of said first signal is responsive to the frequency of said charging signal.

8. The apparatus as set forth in claim 7 wherein said fourth means includes an R-C circuit having an input terminal connected to said decoder/demultiplexer and being adapted to receive said charging signal, an output terminal adapted to produce said first signal, a capacitor having a first terminal connected to said R-C circuit input and output terminals and a second terminal connected to a source of low electrical potential, and a resistor having a first terminal connected to said R-C circuit input and output terminals and a second terminal connected to said low electrical potential source.

9. An apparatus for controllably programming a nonvolatile electrically erasable programmable read only memory (EEPROM), said EEPROM being of the type which requires a write-enable signal during programming, comprising:

a microprocessor adapted to repeatedly produce a pseudo address signal at a preselected frequency, said pseudo address signal corresponding to an unused memory address location;

decoder/demultiplexer for receiving said pseudo address signal and producing a charging signal at a frequency responsive to said pseudo address signal;

an R-C circuit having an input terminal connected to said decoder/demultiplexer and being adapted to receive said charging signal, an output terminal adapted to produce a first signal, a capacitor having a first terminal connected to said R-C circuit input and output terminals and a second terminal connected to a source of low electrical potential, a resistor having a first terminal connected to said R-C circuit input and output terminals and a second terminal connected to said low electrical potential source, and wherein said first signal corresponds to a voltage potential developed across said capacitor in response to said charging signal;

switch means for for receiving said first signal and producing said write-enable signal in response to said first signal reaching a preselected magnitude;

third means for delivering an address signal and a corresponding data signal to said EEPROM while said write-enable signal is produced, said address signal being indicative of an address location in said EEPROM and said data signal corresponding to the data to be stored in said EEPROM address location.

10. A method for controllably programming a nonvolatile electrically erasable programmable read only memory (EEPROM), said EEPROM being of the type which requires a write-enable signal during programming, comprising:

repeatedly producing a pseudo address signal at a preselected frequency;

delivering a write-enable signal to said EEPROM in response to said pseudo address signal being produced a predetermined number of times; and delivering an address signal and a corresponding data signal to said EEPROM during at least a portion of the time said write-enable signal is produced, said address signal being indicative of an address location in said EEPROM and said data signal corresponding to the data to be stored in said EEPROM address location.

11. The method as set forth in claim 10 wherein said write-enable signal is produced in response to said pseudo address signal being produced a predetermined number of times within a preselected time period.

12. The method as set forth in claim 11 wherein the step of producing said write-enable signal includes integrating said pseudo address signal.

13. The method as set forth in claim 10 wherein the step of producing said write-enable signal includes counting said pseudo address signal.

14. The method as set forth in claim 10 wherein the step of producing said write-enable signal includes the steps of:

producing a charging signal having a preselected magnitude and a frequency responsive to the frequency of production of said pseudo address signal;

producing a first signal which varies between first and second voltage thresholds in response to the frequency of said charging signal; and producing said write-enable signal in response to said first signal reaching a preselected magnitude.

* * * * *